United States Patent
He et al.

(10) Patent No.: US 10,998,519 B2
(45) Date of Patent: May 4, 2021

(54) QUANTUM DOT LIGHT-EMITTING DIODE, METHOD FOR PREPARING THE SAME, ARRAY SUBSTRATE AND DISPLAY DEVICE

(71) Applicant: BOE TECHNOLOGY GROUP CO., LTD., Beijing (CN)

(72) Inventors: Yuedi He, Beijing (CN); Boris Kristal, Beijing (CN); Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 395 days.

(21) Appl. No.: 16/305,052

(22) PCT Filed: Mar. 9, 2018

(86) PCT No.: PCT/CN2018/078496
§ 371 (c)(1),
(2) Date: Nov. 27, 2018

(87) PCT Pub. No.: WO2018/171439
PCT Pub. Date: Sep. 27, 2018

(65) Prior Publication Data
US 2020/0321546 A1    Oct. 8, 2020

(30) Foreign Application Priority Data

Mar. 23, 2017   (CN) .......................... 201710180462.X

(51) Int. Cl.
| | | |
|---|---|---|
| *H01L 51/50* | (2006.01) | |
| *H01L 51/56* | (2006.01) | |
| *H01L 51/00* | (2006.01) | |

(52) U.S. Cl.
CPC ........ *H01L 51/5072* (2013.01); *H01L 51/502* (2013.01); *H01L 51/5004* (2013.01);
(Continued)

(58) Field of Classification Search
None
See application file for complete search history.

(56) References Cited

U.S. PATENT DOCUMENTS

2009/0096357 A1* 4/2009 Lee .................... H01L 51/5092
                                                      313/504
2010/0096004 A1   4/2010 Hu et al.
(Continued)

FOREIGN PATENT DOCUMENTS

| CN | 102903855 A | 1/2013 |
|---|---|---|
| CN | 103000813 A | 3/2013 |

(Continued)

OTHER PUBLICATIONS

First Chinese Office Action dated Jan. 29, 2018, received for corresponding Chinese Application No. 201710180462.X.
(Continued)

*Primary Examiner* — Dung A. Le
(74) *Attorney, Agent, or Firm* — Kinney & Lange, P.A,

(57) ABSTRACT

The present disclosure relates to a quantum dot light-emitting diode, comprising: a first electrode layer, a hole transport layer, a quantum dot light-emitting layer, an electron transport layer, and a second electrode layer, which are sequentially formed on a base substrate; and a buffer layer arranged between the quantum dot light-emitting layer and the electron transport layer, wherein the buffer layer is configured such that a difference between an electron injection rate and a hole transport rate of the quantum dot light-emitting layer is less than a preset threshold. The present disclosure further relates to a method for preparing a quantum dot light-emitting diode, and an array substrate and a display device including the quantum dot light-emitting diode.

14 Claims, 2 Drawing Sheets

(52) U.S. Cl.
CPC .......... *H01L 51/56* (2013.01); *H01L 51/0035* (2013.01); *H01L 51/0037* (2013.01); *H01L 51/0042* (2013.01); *H01L 2251/558* (2013.01)

(56) References Cited

U.S. PATENT DOCUMENTS

| | | |
|---|---|---|
| 2011/0227036 A1 | 9/2011 | Vaufrey |
| 2014/0110665 A1 | 4/2014 | Zhang et al. |
| 2019/0067593 A1* | 2/2019 | Cho .................... H01L 51/5096 |
| 2020/0106027 A1* | 4/2020 | Ahn .................... H01L 51/0072 |

FOREIGN PATENT DOCUMENTS

| | | |
|---|---|---|
| CN | 103904178 A | 7/2014 |
| CN | 105261707 A | 1/2016 |
| CN | 105449112 A | 3/2016 |
| CN | 105514290 A | 4/2016 |
| CN | 105576139 A | 5/2016 |
| CN | 106374051 A | 2/2017 |
| CN | 106410055 A | 2/2017 |
| CN | 106816545 A | 6/2017 |
| KR | 20100047481 A | 5/2012 |
| KR | 20120047481 A | 5/2012 |
| WO | 2011044391 A1 | 4/2011 |

OTHER PUBLICATIONS

Written Opinion of the International Search Report dated Mar. 3, 2018, received for corresponding Chinese Application No. PCT/CN2018/078496.

* cited by examiner

QUANTUM DOT LIGHT-EMITTING DIODE, METHOD FOR PREPARING THE SAME, ARRAY SUBSTRATE AND DISPLAY DEVICE

CROSS-REFERENCE TO RELATED APPLICATION

This application is the U.S. national phase of PCT Application No. PCT/CN2018/078496 filed on Mar. 9, 2018, which claims a priority to Chinese Patent Application No. 201710180462.X filed on Mar. 23, 2017, the disclosures of which are incorporated in their entirety by reference herein.

TECHNICAL FIELD

The present disclosure relates to the field of optoelectronic technology, in particular to a quantum-dot light-emitting diode, a method for preparing the same, an array substrate, and a display device.

BACKGROUND

A quantum dot, also known as a semiconductor nanocrystal, is a new type of nano-fluorescent material. As compared with traditional organic fluorescent materials, the quantum dot has many advantages, for example, wide excitation spectrum, narrow emission spectrum, high fluorescence intensity, adjustable emission wavelength, good light, heat and chemical stability, such that it has a broad application prospect in the field of optoelectronic technology. A quantum dot organic light-emitting device prepared by the quantum dot material is an optoelectronic device with great academic value and good commercial prospect, and has the following advantages: low power consumption, high efficiency, quick response and light weight, etc.; a film having a large area may be formed; and more importantly, the physical properties of the inorganic material itself may overcome the problems of thermal decay, photochemical decay and the like of the organic light-emitting material in the organic light-emitting diode (OLED), thereby greatly extending the service life of the device.

At present, in a conventional organic-inorganic hybrid quantum dot light-emitting diode (QLED) device, a quantum dot light-emitting layer is sandwiched between an organic hole transport layer and an inorganic electron transport layer, and thus is of a sandwich structure. However, in the existing devices, there is an imbalance between electron and hole injections, and an inconsistent charge transfer efficiency, resulting in a relatively low efficiency of the quantum dot light-emitting diode.

SUMMARY

According to one aspect of the present disclosure, there is provided a quantum dot light-emitting diode, including: a first electrode layer, a hole transport layer, a quantum dot light-emitting layer, an electron transport layer, and a second electrode layer, which are sequentially formed on a base substrate; and a buffer layer arranged between the quantum dot light-emitting layer and the electron transport layer, wherein the buffer layer and the electron transport layer are configured such that a difference between an electron injection rate and a hole transport rate of the quantum dot light-emitting layer is less than a preset threshold.

Optionally, thicknesses of the buffer layer and the electron transport layer are configured such that the difference between the electron injection rate and the hole transport rate of the quantum dot light-emitting layer is less than the preset threshold.

Optionally, the preset threshold is less than 1/10 of the hole transport rate of the quantum dot light-emitting layer.

Optionally, the buffer layer is made of a material that satisfies the following conditions: a particle size is not more than 3 nm; and electron mobility is on the order of $10^4$ $cm^2/V \cdot s$ to $10^6$ $cm^2/V \cdot s$.

Optionally, the buffer layer is made of graphene.

Optionally, the thickness of the buffer layer is 1% to 20% of the thickness of the electron transport layer.

Optionally, the electron transport layer is made of a material including at least one of an organic electron transport material and a zinc oxide, and the organic electron transport material includes at least one of: 2,9-dimethyl-4,7-biphenyl-1,10-phenanthroline, 4,7-diphenyl-1,10-phenanthroline, 1,3,5-tris(4-pyridin-3-yl-phenyl)benzene, aluminum 8-hydroxyquinoline (Alq3), 3-(biphenyl-4-yl)-5-(4-tert-butylphenyl)-4-phenyl-4H-1,2,4-triazole, and beryllium bis[2-(2-pyridinyl)phenolate].

According to another aspect of the present disclosure, there is provided an array substrate, including a support substrate and the above quantum dot light-emitting diode arranged on the support substrate.

According to one further aspect of the present disclosure, there is provided a display device, including the above quantum dot light-emitting diode.

According to one yet aspect of the present disclosure, there is provided a method for preparing a quantum dot light-emitting diode, including:
  forming a first electrode layer on a base substrate;
  forming a hole injection layer on the first electrode layer;
  forming a hole transport layer on the hole injection layer;
  forming a quantum dot light-emitting layer on the hole transport layer;
  forming a buffer layer on the quantum dot light-emitting layer;
  forming an electron transport layer on the buffer layer, in which the buffer layer and the electron transport layer are configured such that a difference between an electron injection rate and a hole transport rate of the quantum dot light-emitting layer is less than a preset threshold; and
  forming a second electrode layer on the electron transport layer.

Optionally, thicknesses of the buffer layer and the electron transport layer are configured such that the difference between the electron injection rate and the hole transport rate of the quantum dot light-emitting layer is less than the preset threshold.

Optionally, the preset threshold is less than 1/10 of the hole transport rate of the quantum dot light-emitting layer.

Optionally, the buffer layer is made of a material that satisfies the following conditions: a particle size is not more than 3 nm; and electron mobility is on the order of $10^4$ $cm^2/V \cdot s$ to $10^6$ $cm^2/V \cdot s$.

Optionally, the thickness of the buffer layer is 1% to 20% of the thickness of the electron transport layer.

Optionally, the forming the buffer layer on the quantum dot layer includes: preparing the buffer layer on the quantum dot light-emitting layer from graphene through a spin coating process.

Optionally, the forming the electron transport layer on the buffer layer includes: preparing the electron transport layer on the buffer layer through a spin coating process, an evaporation process, or a magnetron sputtering process.

DETAILED DESCRIPTION

The features and principles of the present disclosure will be described in detail below in conjunction with drawings. The embodiments illustrated are merely used for explaining the present disclosure, rather than limiting the protection scope of the present disclosure.

The applicant has found that the highest occupied molecular orbital (the orbit that has the highest energy level of electrons is called the highest occupied orbit, expressed by HOMO) of the organic hole transport material has an energy level in the range from −5.0 eV to −6.0 eV, and if the valence band of the quantum dot is located in the range of −6.0 eV to −7.0 eV, there is a large hole injection barrier; in addition, the mobility of most organic hole transport materials is <$10^{-4}$ $cm^2V^{-1}S^{-1}$, which is adverse to hole injection and transport in the device, while the inorganic electron transport material has a high electron mobility ($10^{-3}$ $cm^2V^{-1}S^{-1}$).

Figure 1:
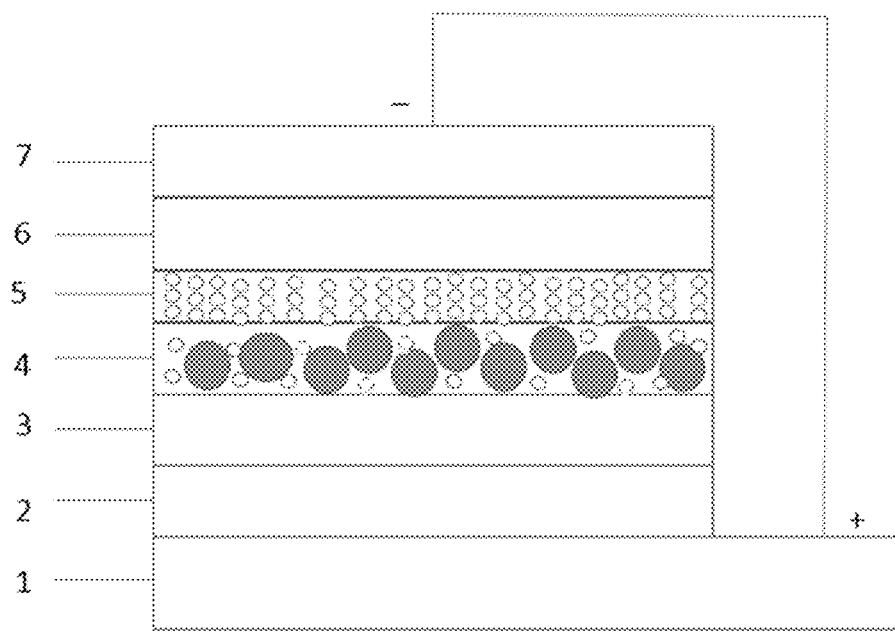
FIG. 1 is a schematic view showing a quantum dot light-emitting diode according to one embodiment of the present disclosure.

As shown in FIG. 1, this embodiment provides a quantum dot light-emitting diode, comprising: a first electrode layer 1, a hole transport layer 3, a quantum dot light-emitting layer 4, an electron transport layer 6, and a second electrode layer 7, which are sequentially formed on a base substrate; and a buffer layer 5 arranged between the quantum dot light-emitting layer 4 and the electron transport layer 6, wherein the buffer layer 5 and the electron transport layer 6 are configured such that a difference between an electron injection rate and a hole transport rate of the quantum dot light-emitting layer 6 is less than a preset threshold.

In this embodiment, a hole injection layer 2 is further arranged between the first electrode layer 1 and the hole transport layer 3.

Optionally, the first electrode layer 1 is a transparent first electrode.

Optionally, the second electrode layer 7 is a metal second electrode.

The buffer layer 5 is configured such that the difference between the electron injection rate and the hole transport rate of the quantum dot light-emitting layer 4 is less than the preset threshold, thereby promoting the transport balance between holes and electrons in the quantum dot light-emitting layer 4.

Optionally, thicknesses of the buffer layer and the electron transport layer are configured such that the difference between the electron injection rate and the hole transport rate of the quantum dot light-emitting layer is less than the preset threshold.

Optionally, the preset threshold is less than 1/10 of the hole transport rate of the quantum dot light-emitting layer.

In the embodiment, the buffer layer 5 is made of a material that satisfies the following conditions: a particle size is not more than 3 nm; and electron mobility is on the order of $10^4$ $cm^2/V·s$ to $10^6$ $cm^2/V·s$.

Optionally, the buffer layer 5 is made of graphene.

As a buffer layer 5, graphene may have the following effect.

Figure 2:
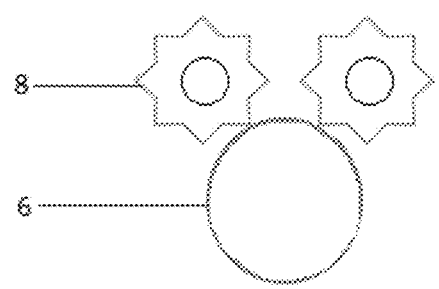
FIG. 2 is a schematic view showing a quantum dot light-emitting layer and an electron transport layer in related art.
Figure 3:
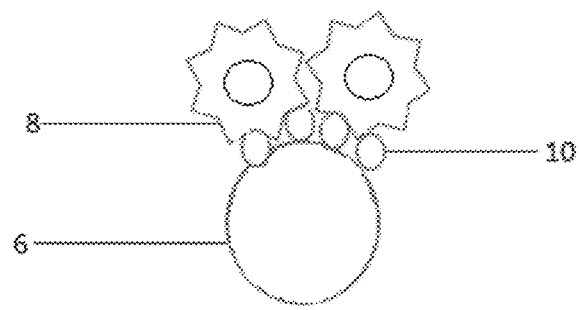
FIG. 3 is a schematic view showing a quantum dot light-emitting layer, a buffer layer and an electron transport layer according to one embodiment of the present disclosure.
Figure 4:
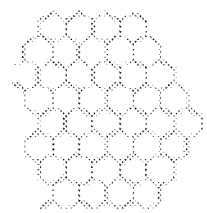
FIG. 4 is a schematic view showing a buffer layer according to one embodiment of the present disclosure.

1. Since graphene is very dense, it is capable of filling the pores between quantum dots and forms a dense graphene film to improve film forming ability, as shown in FIG. 3. Through comparing FIG. 2 of the related art with FIG. 3, and with reference to FIG. 4, it can be seen that since the particles of graphene 10 are small, the pores between the quantum dots 8 are filled; and the graphene film is very dense, which is advantageous for electron transport.

2. Graphene has extremely high conductivity, which is advantageous for enhancing electron coupling, so that electrons may be quickly transported from the electron transport layer 6 to the quantum dot light-emitting layer 4, thereby increasing the selection range of the material for electron transport layer 6, without having to limit the selection to the ZnO nanoparticle film generally used in the prior art, for example, an organic electron transport material or a sputtered ZnO film may be selected.

3. Through adjusting the overall mobility of the graphene layer and the adjacent electron transport layer 6 to match the mobility of the hole transport layer 3, thereby promoting the transport balance between holes and electrons in the quantum dot light-emitting layer 4.

When the electron transport rate of the electron transport layer 6 is high, that is, when a difference between the electron transport rate and the hole transport rate goes beyond the scope of the preset threshold, the thickness of the buffer layer 5 may be increased, thereby increasing the transmission path from the electron transport layer 6 to the quantum dot light-emitting layer 4, and thus decreasing the number of electrons entering the quantum dot light-emitting layer 4 per unit time, so as to balance the hole transport and electron transport in the quantum dot light-emitting layer 4, that is, the difference between the electron transport rate and the hole transport rate located within the scope of the preset threshold.

When the electron transport rate of the electron transport layer 6 is low, the graphene has extremely high conductivity, which is advantageous for enhancing the characteristics of electron coupling, so that electrons may be rapidly transported from the electron transport layer 6 to the quantum dot light-emitting layer 4, and the balance between the hole transport and the electron transport in the quantum dot light-emitting layer 4 may be adjusted by adjusting the thickness of graphene.

Optionally, the thickness of the buffer layer 5 is 1% to 20% of the thickness of the electron transport layer 6.

Optionally, the thickness of the buffer layer 5 is 0.5 nm to 50 nm.

Optionally, the thickness of the buffer layer 5 is 40 nm.

Regarding the thickness of the other layers, for example, the thickness of the first electrode layer 1 may be 70 nm to 200 nm; the thickness of the hole transport layer 3 may be 50 nm to 100 nm; the thickness of the quantum dot light-emitting layer 4 may be 10 nm to 60 nm; the thickness of the electron transport layer 6 may be 40 nm to 150 nm; and the thickness of the second electrode layer 7 may be 80 nm to 150 nm.

In this embodiment, the electron transport layer 6 may be made of a material including at least one of an organic electron transport material and a zinc oxide, and the organic electron transport material includes at least one of 2,9-dimethyl-4,7-biphenyl-1,10-phenanthroline (BCP), 4,7-diphenyl-1,10-phenanthroline (Bphen), 1,3,5-tris(4-pyridin-3-yl-phenyl)benzene, aluminum 8-hydroxyquinoline (Alq3), 3-(biphenyl-4-yl)-5-(4-tert-butylphenyl)-4-phenyl-4H-1,2,4-triazole (TAZ), and beryllium bis[2-(2-pyridinyl)phenolate] (Be(PP)$_2$).

The present disclosure further provides an array substrate, including a support substrate and the above quantum dot light-emitting diode arranged on the support substrate.

The present disclosure further provides a display device, including the above quantum dot light-emitting diode.

The present disclosure further provides a method for preparing a quantum dot light-emitting diode, including:

forming a first electrode layer 1 on a base substrate;

forming a hole injection layer 2 on the first electrode layer 1;

forming a hole transport layer 3 on the hole injection layer 2;

forming a quantum dot light-emitting layer 4 on the hole transport layer 3;

forming a buffer layer 5 on the quantum dot light-emitting layer 4;

forming an electron transport layer 6 on the buffer layer 5, in which the buffer layer 5 and the electron transport layer 6 are configured such that a difference between an electron injection rate and a hole transport rate of the quantum dot light-emitting layer 4 is less than a preset threshold; and forming a second electrode layer 7 on the electron transport layer 6.

Optionally, the forming the first electrode layer 1 on the base substrate includes: washing the patterned transparent conductive film substrate with acetone, ethanol, deionized water, or isopropyl alcohol, and subjecting it to plasma or ultraviolet light UV irradiation treatment to obtain the first electrode layer 1.

Optionally, the forming the hole injection layer 2 on the first electrode layer 1 includes: preparing the hole injection layer 2 on the first electrode layer 1 through a spin coating process.

Optionally, the forming the hole transport layer 3 on the hole injection layer 2 includes: preparing the hole transport layer 3 on the hole injection layer 2 through a spin coating process.

Optionally, the forming the quantum dot light-emitting layer 4 on the hole transport layer 3 includes: preparing one layer of a quantum dot film on the hole transport layer 3 through a spin coating process, in which the quantum dot film is the quantum dot light-emitting layer 4.

Optionally, the forming the buffer layer 5 on the quantum dot light-emitting layer 4 includes: preparing the buffer layer 5 from graphene on the quantum dot light-emitting layer 4 through a spin coating process.

Optionally, the forming the electron transport layer 6 on the buffer layer 5 includes: preparing the electron transport layer 6 on the buffer layer 5 through a spin coating process, an evaporation process, or a magnetron sputtering process.

Optionally, the forming the second electrode layer 7 on the electron transport layer 6 includes: preparing the metal second electrode layer 7 on the electron transport layer 6 through a vacuum evaporation process, in which the vacuum degree is <10$^{-6}$ torr, the evaporation rate is 1 to 5 angstroms per second, and annealing the metal second electrode layer 7 under a nitrogen atmosphere in a glove box at 140° C. to 150° C. for 30 min.

The method for preparing the quantum dot light-emitting diode will be described in detail below.

The patterned transparent conductive film substrate was washed with acetone, ethanol, deionized water, or isopropyl alcohol, and subjected to plasma or ultraviolet light UV irradiation treatment to obtain the transparent first electrode layer 1.

A PEDOT:PSS solution (an aqueous solution of a polymer, in which PEDOT is poly(3,4-ethylenedioxythiophene), and PSS is a polystyrene sulfonate) was coated on the treated substrate through a spin coating process, and annealed at 120° C. for 20 min to form a dense PEDOT:PSS film, that is, the hole injection layer 2.

The hole transport layer 3 was prepared as follows: a polyvinylcarbazole (PVK) solution was coated on the hole injection layer 2 through a spin coating process, and annealed at 130° C. for 20 min to form a PVK film, that is, the hole transport layer 3.

A quantum dot solution was coated on the hole transport layer 3 through a spin coating process, and annealed at 120° C. for 20 min to form the quantum dot light-emitting layer 4.

A graphene solution was coated on the quantum dot light-emitting layer 4 through a spin coating process, and annealed at 100° C. for 10 min to form the buffer layer 5.

Bphen was vacuum-deposited on the buffer layer 5 through an evaporation process to form the electron transport layer 6.

An Al cathode was vacuum-deposited on the electron transport layer 6 through an evaporation process, to form the second electrode layer 7.

In another embodiment, the method for preparing the quantum dot light-emitting diode is shown as follows.

The patterned transparent conductive film substrate was washed with acetone, ethanol, deionized water, or isopropyl alcohol, and subjected to plasma or ultraviolet light UV irradiation treatment to obtain the transparent first electrode layer 1.

A PEDOT:PSS solution was coated on the treated substrate through a spin coating process, and annealed at 120° C. for 20 min to form a dense PEDOT:PSS film, that is, the hole injection layer 2.

A PVK solution was coated on the hole injection layer 2 through a spin coating process, and annealed at 130° C. for 20 min to form a PVK film, that is, the hole transport layer 3.

A quantum dot solution was coated on the hole transport layer 3 through a spin coating process, and annealed at 120° C. for 20 min to form the quantum dot light-emitting layer 4.

A graphene solution was coated on the quantum dot light-emitting layer 4 through a spin coating process, and annealed at 100° C. for 10 min to form the buffer layer 5.

ZnO was sputtered on the buffer layer 5 through a magnetron sputtering process to form the electron transport layer 6.

An Al cathode was vacuum-deposited on the electron transport layer 6 through an evaporation process, to form the second electrode layer 7.

The above descriptions are alternative embodiments of the present disclosure. It should be noted that a person skilled in the art would make several improvements and substitutions without departing from the principles of the present disclosure. These improvements and modifications should also be regarded as the protection scope of the present disclosure.

What is claimed is:

1. A quantum dot light-emitting diode, comprising:
a first electrode layer, a hole transport layer, a quantum dot light-emitting layer, an electron transport layer, and a second electrode layer, which are sequentially formed on a base substrate; and
a buffer layer arranged between the quantum dot light-emitting layer and the electron transport layer,
wherein the buffer layer and the electron transport layer are configured such that a difference between an electron injection rate and a hole transport rate of the quantum dot light-emitting layer is less than a preset threshold, wherein the preset threshold is less than 1/10 of the hole transport rate of the quantum dot light-emitting layer.

2. The quantum dot light-emitting diode of claim 1, wherein thicknesses of the buffer layer and the electron transport layer are configured such that the difference between the electron injection rate and the hole transport rate of the quantum dot light-emitting layer is less than the preset threshold.

3. The quantum dot light-emitting diode of claim 1, wherein the buffer layer is made of a material that satisfies the following conditions: a particle size is not more than 3 nm; and electron mobility is on the order of $10^4$ cm$^2$/V·s to $10^6$ cm$^2$/V·s.

4. The quantum dot light-emitting diode of claim 3, wherein the buffer layer is made of graphene.

5. The quantum dot light-emitting diode of claim 4, wherein a thickness of the buffer layer is 1% to 20% of a thickness of the electron transport layer.

6. The quantum dot light-emitting diode of claim 1, wherein the electron transport layer is made of a material comprising at least one of an organic electron transport material and a zinc oxide, and the organic electron transport material comprises at least one of: 2,9-dimethyl-4,7-biphenyl-1,10-phenanthroline, 4,7-diphenyl-1,10-phenanthroline, 1,3,5-tris(4-pyridin-3-yl-phenyl)benzene, aluminum 8-hydroxyquinoline, 3-(biphenyl-4-yl)-5-(4-tert-butylphenyl)-4-phenyl-4H-1,2,4-triazole, and beryllium bis[2-(2-pyridinyl) phenolate].

7. An array substrate, comprising a support substrate and the quantum dot light-emitting diode of claim 1 arranged on the support substrate.

8. A display device, comprising the array substrate of claim 7.

9. A method for preparing a quantum dot light-emitting diode, comprising:
forming a first electrode layer on a base substrate;
forming a hole injection layer on the first electrode layer;
forming a hole transport layer on the hole injection layer;
forming a quantum dot light-emitting layer on the hole transport layer;
forming a buffer layer on the quantum dot light-emitting layer;
forming an electron transport layer on the buffer layer, wherein the buffer layer and the electron transport layer are configured such that a difference between an electron injection rate and a hole transport rate of the quantum dot light-emitting layer is less than a preset threshold; and
forming a second electrode layer on the electron transport layer.

10. The method of claim 9, wherein thicknesses of the buffer layer and the electron transport layer are configured such that the difference between the electron injection rate and the hole transport rate of the quantum clot light-emitting layer is less than a preset threshold, wherein the preset threshold is less than 1/10 of the hole transport rate of the quantum dot light-emitting layer.

11. The method of claim 9, wherein the buffer layer is made of a material that satisfies the following conditions: a particle size is not more than 3 nm; and electron mobility is on the order of $10^4$ cm$^2$/V·s to $10^6$ cm$^2$/V·s.

12. The method of claim 9, wherein a thickness of the buffer layer is 1% to 20% of a thickness of the electron transport layer.

13. The method of claim 9, wherein forming the buffer layer on the quantum dot layer comprises: preparing the buffer layer from graphene on the quantum dot light-emitting layer through a spin coating process.

14. The method of claim 9, wherein forming the electron transport layer on the buffer layer comprises: preparing the electron transport layer on the buffer layer through a spin coating process, an evaporation process, or a magnetron sputtering process.

* * * * *